US012619291B2

(12) United States Patent
Chen et al.

(10) Patent No.: US 12,619,291 B2
(45) Date of Patent: May 5, 2026

(54) HOT PLUG REDUNDANT PUMP WITH ELECTRONICALLY CONTROLLED VALVE

(71) Applicant: Quanta Computer Inc., Taoyuan City (TW)

(72) Inventors: Chao-Jung Chen, Taoyuan City (TW); Huan-Shu Chien, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 377 days.

(21) Appl. No.: 18/480,955

(22) Filed: Oct. 4, 2023

(65) Prior Publication Data

US 2024/0385663 A1　Nov. 21, 2024

Related U.S. Application Data

(60) Provisional application No. 63/502,844, filed on May 17, 2023.

(51) Int. Cl.
G06F 1/20　　(2006.01)
H05K 7/20　　(2006.01)

(52) U.S. Cl.
CPC ........... G06F 1/20 (2013.01); H05K 7/20272 (2013.01)

(58) Field of Classification Search
CPC .. G06F 1/20; H05K 7/20272; H05K 7/20781; F04B 23/04; F04D 13/12; F04D 15/0005;
(Continued)

(56) References Cited

U.S. PATENT DOCUMENTS 6,714,412 B1 * 3/2004 Chu ..................... H05K 7/2079
165/157
7,149,084 B2 * 12/2006 Matsushima ......... H01L 23/473
174/15.1
(Continued)

FOREIGN PATENT DOCUMENTS

CN　　216692234 U　　6/2022
CN　　115248625 A　　10/2022
CN　　115279113 A　　11/2022

OTHER PUBLICATIONS

TW Office Action for Application No. 113108141 mailed Dec. 9, 2024, w/ First Office Action Summary, 4 pp.
(Continued)

*Primary Examiner* — Bryan M Lettman
(74) *Attorney, Agent, or Firm* — NIXON PEABODY LLP

(57) ABSTRACT

A pump module for a coolant distribution unit for cooling a heat-generating component is disclosed. A manifold unit has a supply connector to supply coolant to the heat-generating component and a collection connector to collect coolant from a heat exchanger. A first replaceable pump circulates coolant and includes an inlet connector having a valve powered by a first motor. An outlet connector has a valve powered by a second motor. The first pump has an input to activate the motors to move the valves between an open position allowing coolant flow and a closed position. A second pump has an inlet and an outlet coupled to the manifold. The second pump circulates coolant from the inlet to the outlet. The first pump may be disconnected from the manifold unit by activating the motors to close the valves, while the second pump continues to circulate coolant through the manifold unit.

19 Claims, 8 Drawing Sheets

(58) Field of Classification Search
CPC . F04D 15/0011; F04D 15/0072; F04D 15/029
See application file for complete search history.

(56) References Cited

U.S. PATENT DOCUMENTS

| | | | | |
|---|---|---|---|---|
| 7,420,804 B2 * | 9/2008 | Leija | H05K 7/20772 361/679.48 | |
| 2005/0244280 A1 * | 11/2005 | Malone | F04B 23/06 257/E23.098 | |
| 2006/0065874 A1 * | 3/2006 | Campbell | H05K 7/20772 251/348 | |
| 2017/0013746 A1 * | 1/2017 | Campbell | H05K 7/20736 | |
| 2019/0182988 A1 * | 6/2019 | Lunsman | H05K 7/20281 | |

OTHER PUBLICATIONS

TW Search Report for Application No. 113108141 mailed Dec. 9, 2024, w/ First Office Action, 1 p.

* cited by examiner

HOT PLUG REDUNDANT PUMP WITH ELECTRONICALLY CONTROLLED VALVE

CROSS-REFERENCE TO RELATED APPLICATIONS

This application claims priority from and benefit of U.S. Provisional Patent Application Ser. No. 63/502,844, filed on May 17, 2023, which is hereby incorporated by reference herein in its entirety.

TECHNICAL FIELD

The present invention relates generally to liquid cooling systems, and more specifically, to a redundant pump with an electronically controlled ball valve allowing a liquid cooling system to function when a pump is taken off-line.

BACKGROUND

Electronic components, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the server to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a fan system.

Due to the improvement of high-performance systems, the amount of heat that needs to be removed becomes higher with each new generation of electronic components. With the advent of more powerful components, traditional air cooling, in combination with fan systems, is inadequate to sufficiently remove heat generated by newer generation components. The development of liquid cooling has been spurred by the need for increased cooling. Liquid cooling is the currently accepted solution for rapid heat removal due to the superior thermal performance from liquid cooling. At room temperature, the heat transfer coefficient of air is only 0.024 W/mK, while a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

In rack level liquid cooling system designs, the cooling liquid source includes a closed loop cooling system and an open loop cooling system to facilitate heat exchange. Known closed loop liquid cooling systems use heat exchange to cool hot water, which is heated from the heat source. Heat is then removed from the hot water in the closed loop liquid cooling system via an open loop system such as a radiator in proximity to a fan wall. The closed loop cooling system includes a heat source such as a computer system and a heat exchanger. A liquid flow pipe carries coolant liquid to the heat source. Heat generated by the heat source is transferred to the coolant liquid. A liquid flow pipe carries heated liquid away from the heat source. The heat exchanger has a radiator where the returned coolant flows.

The radiator transfers heat from the heated liquid and thus results in cooler liquid to be circulated to the liquid flow pipe. An open loop air cooling system, such as a fan wall, generates air flow that carries away heat absorbed by the radiator of the heat exchanger.

When using liquid to cool a server system, pumps are required to circulate the coolant into the heat source, into the liquid flow pipes, and through the heat exchanger. The liquid cooling system requires the pump to remain operational at all times to circulate the coolant. In current liquid cooling systems, operators need to shut down the computer system to repair or replace the pump. Thus, current liquid cooling systems may result in unnecessary computer downtime when pumps require replacement. One solution may be a backup pump or multiple pumps. In the case of a pump malfunction, one of the pumps may be removed, but the other pump or pumps may continue to operate, and thus the server system may still function. However, disconnecting the malfunctioning pump is cumbersome as connectors must be closed to prevent leaking. Moreover, the pump may be disconnected accidently before closing the connectors, resulting in leaks.

Thus, there is a need for a coolant distribution unit for a liquid cooling system that allows continual operation of a computer system even when a pump is being replaced. There is another need for an automatic mechanism to divert coolant circulation to an operational pump while another pump is taken offline. There is also another need for a coolant distribution unit that allows removal of a redundant pump without coolant leaks.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an example replaceable pump for circulating coolant is disclosed. The pump includes an inlet connector having a valve powered by a first motor. The pump includes an outlet connector having a valve powered by a second motor. A circulator propels coolant between inlet connector and the outlet connector. A valve control input activates the first and second motors to move the valves between an open position allowing coolant flow and closed position blocking coolant flow.

A further implementation of the example replaceable pump is where the valves are ball valves rotated by the first and second motors. Another implementation is where the inlet connector includes a first electrical connector. The inlet connector is operable to be in fluid connection with an outlet connector of a separation manifold. The outlet connector of the separation manifold includes a valve powered by a third motor controlled by the first electrical connector. The outlet connector includes a second electrical connector. The outlet connector is operable to be in fluid connection with an inlet connector of a merge manifold. The inlet connector of the merge manifold includes a valve powered by a fourth motor controlled by the second electrical connector. Another implementation is where the example replaceable pump includes a locking mechanism operable to keep the inlet and outlet connectors connected when the valves are in the open position. Another implementation is where the example replaceable pump includes a rotatable handle assembly having a locked position that prevents removal of the pump from a coolant distribution unit and a pull down position that allows removal of the pump from the coolant distribution unit. The locking mechanism holds the rotatable handle assembly in the locked position.

According to certain aspects of the present disclosure, an example coolant distribution unit for circulating coolant to a heat-generating component is disclosed. The coolant distribution unit includes a manifold unit having a supply connector to supply coolant to the heat-generating component and a collection connector to collect coolant from a heat exchanger. A first pump is fluidly coupled to the manifold unit via a first inlet connector having a first electronically controlled valve and a second outlet connector having a second electronically controlled valve. The first pump circulates coolant from the first inlet connector to the second outlet connector. A second pump has an inlet connector coupled to the manifold unit and an outlet connector coupled to the manifold. The second pump circulates coolant from the inlet connector to the outlet connector. The first pump may be disconnected from the manifold unit when the first and second valves are closed to prevent coolant flow. The second pump continues to circulate coolant through the manifold unit.

A further implementation of the example coolant distribution unit is where the manifold unit includes a separation manifold coupled to the inlet connectors of the first and second pumps and a merge manifold coupled to the outlet connectors of the first and second pumps. Another implementation is where the example coolant distribution system includes a third pump having an inlet connector coupled to the manifold unit and an outlet connector coupled to the manifold unit. The third pump circulates coolant from the inlet connector to the outlet connector. The third pump continues to circulate coolant when the second pump is disconnected from the manifold unit. Another implementation is where the heat-generating component includes a heat-generating computational component and internal conduits to circulate the coolant received from the manifold unit. Another implementation is where the heat-generating component is one of an application server, a storage server, a storage device, or a network switch. Another implementation is where the coolant distribution unit includes a housing having an open end. The housing holds the first and second pumps. The first and second pumps may be removed from the housing from the open end. Another implementation is where the first and second electronically controlled valves are ball valves rotated by a motor controlled by a push button in the first pump. Another implementation is where the first pump includes a locking mechanism preventing disconnection of the first pump from the manifold.

According to certain aspects of the present disclosure, an example computer system is disclosed. The computer system includes a computer component having a heat-generating device, a conduit to circulate coolant, a hot coolant connector, and a cold coolant connector. A heat exchanger is configured to receive hot coolant from the hot coolant connector and supply cooled coolant. A manifold unit is fluidly coupled to the heat exchanger to receive the cooled coolant and supply the cooled coolant to the cold coolant connector. A pump module is coupled to the manifold unit to circulate the coolant between the heat exchanger, the manifold unit, and the computer component. The pump module includes a first pump fluidly coupled to the manifold unit via a first inlet connector having a first electronically controlled valve and a second outlet connector having a second electronically controlled valve. The first pump circulates coolant from the first inlet connector to the second outlet connector. A second pump has an inlet connector coupled to the manifold unit and an outlet connector coupled to the manifold. The second pump circulates coolant from the inlet connector to the outlet connector, wherein the first pump may be disconnected from the manifold unit when the first and second valves are closed to prevent coolant flow. The second pump continues to circulate coolant through the manifold unit.

A further implementation of the example computer system is where the manifold unit includes a separation manifold coupled to the inlet connectors of the first and second pumps and a merge manifold coupled to the outlet connectors of the first and second pumps. Another implementation is where the pump module further includes a third pump having an inlet connector coupled to the manifold unit and an outlet connector coupled to the manifold unit. The third pump circulates coolant from the inlet connector to the outlet connector. The third pump continues to circulate coolant when the second pump is disconnected from the manifold unit. Another implementation is where the computer component includes internal conduits to circulate the coolant received from the manifold unit. Another implementation is where the computer component is one of an application server, a storage server, a storage device, or a network switch. Another implementation is where the example computer system includes a coolant distribution unit having a housing, wherein the housing holds the manifold unit and pump module. Another implementation is where the example computer system includes a rack holding the computer component, the manifold unit and the pump module, wherein the rack includes a door holding the heat exchanger.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
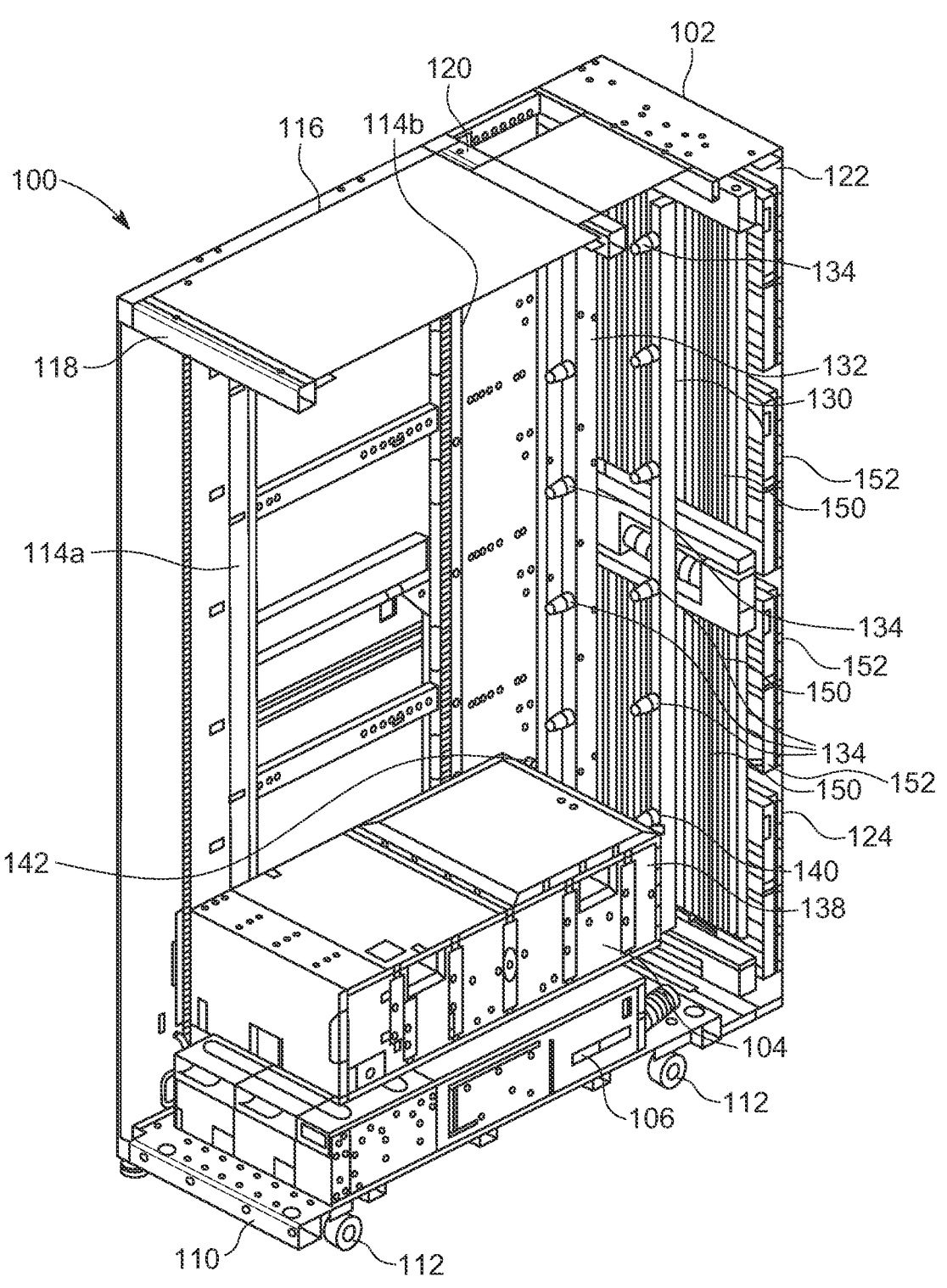
FIG. 1 is a perspective partial cutaway view of a computer system with a liquid cooling system, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a coolant distribution unit of a liquid cooling system. The coolant distribution unit has at least two hot-swappable pump modules that circulate liquid coolant to a manifold unit. Each of the pump modules has a pair of quick connectors for the liquid coolant. The quick connectors of each pump module have a motorized ball valve that may be rotated to an open position to allow coolant flow and a closed position to block coolant flow. The quick connector of each pump is mated to a corresponding quick connector on the manifold. The quick connector on the manifold also has a motorized ball valve. The manifold unit (i) separates the received liquid coolant into the two pumps, and (ii) merges the now pressurized liquid coolant from the two pumps into a coolant supply connector. The pressurized liquid coolant is then circulated to components that require cooling such as computer servers. When a pump requires service, an operator may press a button on the pump module to close the ball valves of the quick connectors. This allows the operator to detach the pair of quick connectors and thus remove the pump module. The manifold unit will route liquid coolant through the remaining pump for providing circulation, allowing the cooling system to continue operation.

FIG. 1 is a partial cutaway view that shows an example computer system 100 that includes a rack 102, a heat-generating component 104, and a coolant distribution unit 106. Although only one heat-generating component 104 is shown for ease of illustration, it is understood that the rack 102 may hold numerous heat-generating components that are stacked over the coolant distribution unit 106. In this example the heat-generating component 104 may be a computer component such as a storage server, an application server, a network switch, or any other electronic device. Each of the heat-generating components such as the heat-generating component 104, has a fully sealed chassis to allow circulation of coolant to cool internal elements in the chassis by a liquid cooling system.

The rack 102 includes a rectangular bottom frame 110. The bottom frame 110 includes a set of wheels 112 attached to the bottom of the bottom frame 110. The wheels 112 allow the rack 102 to be moved to desired locations in a data center. Side members of the bottom frame 110 support vertical supports 114a, 114b, defining one side of the rack 102. Similar vertical supports are provided on the other side of the rack 102 omitted from the view in FIG. 1. A top panel 116 connects the tops of the vertical supports 114a and 114b. The top panel 116 holds lateral bracing members 118 and 120, which connect the tops of the vertical supports 114a and 114b to the vertical supports of the opposite side of the rack 102. Each of the vertical supports 114a and 114b may include holes to allow pins to be inserted. The pins may support shelves that may be installed between (i) the vertical supports 114*a* and 114*b* and (ii) the corresponding supports on the other side of the rack 102. The vertical support 114*b* is near a rear end of the rack 102 that includes a rear door 122. The rear door 122 may be opened to allow access to the rear sides of the components stored in the rack 102. As will be explained the rear door 122 supports a heat exchanger 124 that is part of the liquid cooling system of the rack 102.

The vertical support 114*a* is close to an open front end of the rack 102. The component 104 and the coolant distribution unit 106 are generally installed from the front end of the rack 102 between the supports on one of the shelves. The components thus may be pushed into the rack 102 until they contact a stop mechanism. The individual component 104, as well as the coolant distribution unit 106, may also be pulled out of the rack 102 from the front of the rack 102, between the supports such as the vertical support 114*a*, for replacement or service.

The coolant distribution unit 106 is mounted on the bottom frame 110, under the stack of heat-generating components such as the component 104, in this example. The coolant distribution unit 106 may have replaceable modules such as pumps that may be inserted from the front end of the rack 102. Each of the shelves attached to the vertical supports 114*a* and 114*b* may hold one or more of the heat-generating components. The shelves may be arranged to have different heights between the shelves. It is understood that any number of shelves and corresponding heat-generating components may be installed in the rack 102. In this example, the placement of the component 104 in the rack 102 is in a horizontal orientation. However, with additional internal structures connected to the vertical supports 114*a* and 114*b*, the heat-generating component 104 could be in a vertical orientation.

The rack 102 supports a cold manifold 130 and a hot manifold 132, each of which extends over the height of the rack 102 at the rear of the rack 102 between the vertical supports 114*a* and 114*b*. The cold manifold 130 is fluidly connected to the coolant distribution unit 106. The hot manifold 132 is fluidly connected to the heat exchanger 124. Each of the manifolds 130 and 132 can allow coolant to circulate along the respective length of the manifold. The manifolds 130 and 132 have respective fluid couplers 134 spaced at periodic intervals that allow fluid communication to one of the components such as the component 104.

The component 104 includes a fully sealed chassis 138 that encloses the electronics of the component 104. In this example, the rear of the chassis 138 of the component 104 includes an inlet connector 140, which may be connected to one of the fluid couplers 134 of the cold manifold 130. The rear of the chassis 138 also includes an outlet connector 142, which may be connected to one of the fluid couplers 134 of the hot manifold 132.

The fully sealed chassis 138 encloses electronic components, power supplies, circuit boards, device cards, processors, memory devices, and other elements. The chassis 138 may include an internal network of fluid conduits that circulate coolant around the internal elements of the component 104. The coolant is fully sealed by the chassis 138 and can only enter or exit the chassis 138 via the inlet connector 140 or the outlet connector 142.

For example, the component 104 may be an application server having processing devices such as CPUs and GPUs. The component 104 may include cold plates in contact with the CPUs and GPUs, as well as adjacent memory devices such as DIMMs. Coolant is circulated through the cold plates to carry away heat generated by the processing devices and memory devices. In this example, the individual heat-generating component 104 may be inserted on a shelf from the front of the rack 102. Once in place, the inlet connector 140 is fluidly connected with one of the fluid couplers 134 of the cold manifold 130, and the outlet connector 142 is fluidly connected with one of the fluid couplers 134 of the hot manifold 132. The component 104 may be connected to a power supply for power and other cables for carrying data signals. Any heat generating component such as a server, a storage device, a network switch, a router, and the like may be installed and cooled by the coolant supplied by the cold manifold 130.

The heat exchanger 124 in this example is part of the liquid cooling system and includes a series of radiators 150 that receive the heated coolant from the hot manifold 132. The radiators 150 allow the heated coolant to be cooled via a series of fan walls 152 that are mounted in proximity to each of the radiators 150. The cooled coolant exits from the radiators 150 and is routed to the coolant distribution unit 106.

The manifolds 130 and 132 circulate coolant to the component 104 through a closed loop formed with the coolant distribution unit 106 and the heat exchanger 124. Thus, the coolant liquid will flow into the component 104 from the inlet connector 140 from the cold manifold 130. The coolant will circulate through the internal conduits of the component 104 to absorb heat from the internal elements, and flow out of the component 104 through the outlet connector 142 to the hot manifold 132. The heated coolant will be circulated to the heat exchanger 124. The heat exchanger 124 removes the heat from the heated coolant via the radiators 150 and the fan wall 152. The cooled coolant is routed to the coolant distribution unit 106. The coolant distribution unit 106 includes a reservoir to store coolant and pumps to circulate the coolant through the manifolds 130 and 132 and the heat exchanger 124. The pumps in the coolant distribution unit 106 provide pressure to circulate the cooled coolant to the cold manifold 130.

Figure 2:
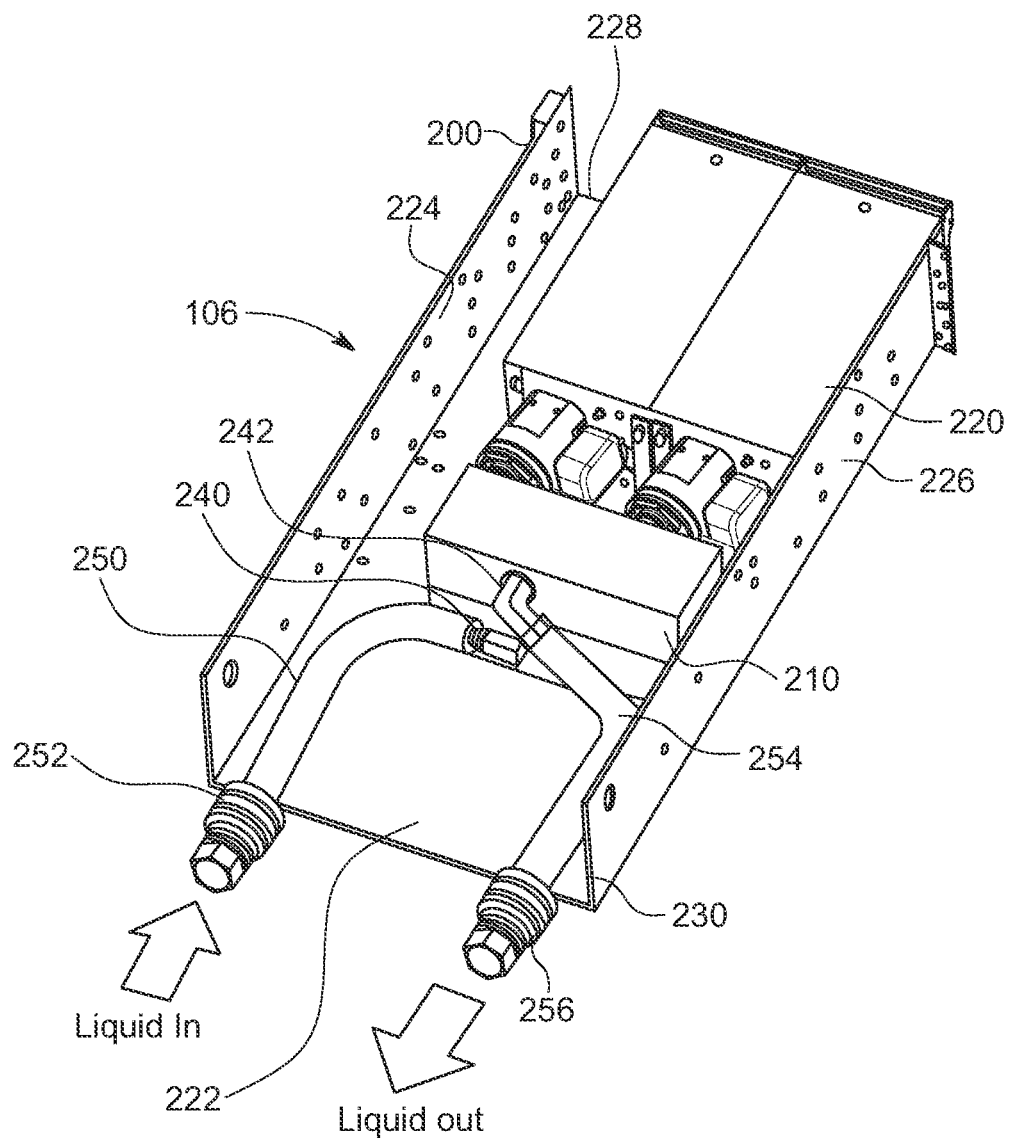
FIG. 2 is a perspective cutaway view of the pump module of the liquid cooling system in FIG. 1 with redundant pumps, according to certain aspects of the present disclosure.

FIG. 2 is a cutaway perspective view of the coolant distribution unit 106. The coolant distribution unit 106 includes a housing 200, a manifold unit 210 and a pump module 220. The housing 200 includes a bottom panel 222 and two side walls 224 and 226. The side walls 224 and 226 define a front end 228 and a rear end 230. The pump module 220 in this example includes at least two pumps, each of which may be inserted from the front end 228 of the housing 200. The pump module 220(*i*) receives coolant from by the manifold unit 210 and (ii) provides circulatory pressure to the coolant to be supplied by the manifold unit 210 to the liquid cooling system.

The manifold unit 210 includes a collection connector 240 that receives coolant and a supply connector 242 that supplies pressurized coolant from the pump module 220. The collection connector 240 is connected to a hose 250 that has a connector 252 that may be fluidly connected to the heat exchanger 124 in FIG. 1 to receive the cooled coolant. The supply connector 242 is connected to a hose 254 that has a connector 256 that may be fluidly connected to the cold manifold 130 in FIG. 1 to supply coolant to the cold manifold 130. Thus, the supply connector 242 supplies coolant to heat-generating components such as the component 104 in FIG. 1.

Figure 3:
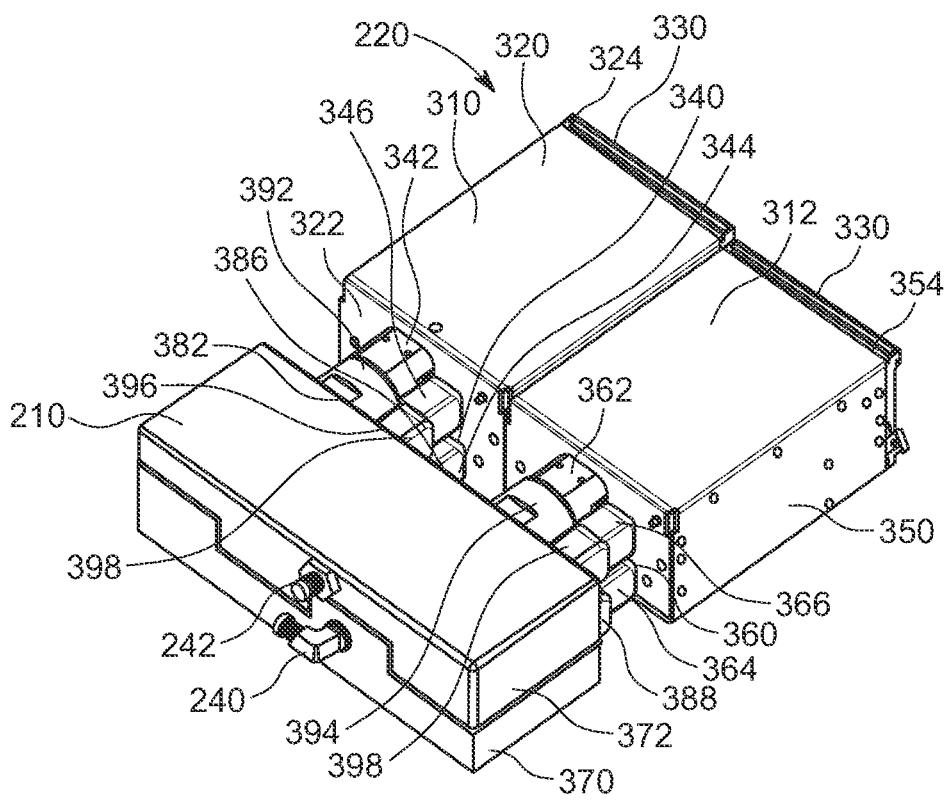
FIG. 3 is a back perspective view of the example manifold unit and redundant pumps of the cooling system in FIG. 2 according to certain aspects of the present disclosure.
Figure 4:
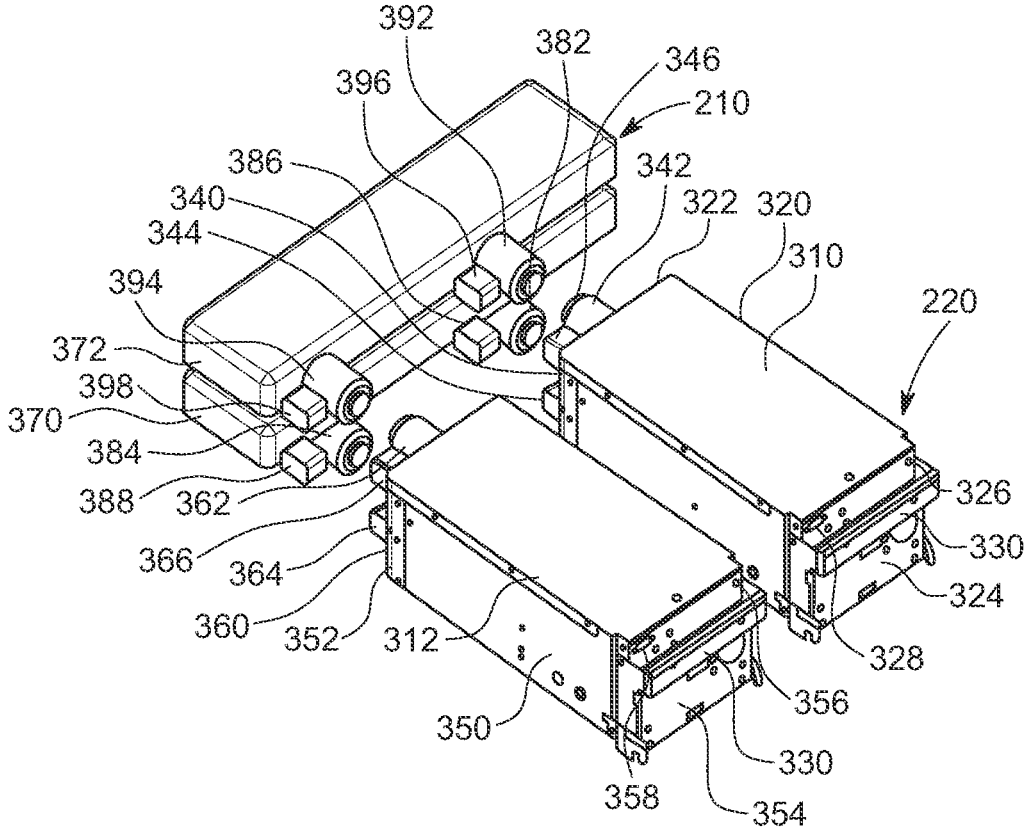
FIG. 4 is a front perspective view of the redundant pumps of the cooling system in FIG. 2 with the pump valve and lock control according to certain aspects of the present disclosure.

FIG. 3 is a rear perspective view of the manifold unit 210 and the pump module 220 in FIG. 2. FIG. 4 is a front perspective view of the manifold unit 210 and the pump module 220. In this example, the pump module 220 includes two pumps 310 and 312. Each of the pumps 310 and 312 are modular units and are identical to each other. The pumps 310 and 312 are controlled by a controller (not shown) to set the flow rate of the pumps 310 and 312. The pumps 310 and 312 of the pump module 220 circulate the liquid coolant through the manifold unit 210 as part of the closed loop cooling system described above. Although two pumps are provided in this example, it is to be understood that additional pumps may be used to increase overall flow rate of coolant circulated by the manifold unit 210.

The pump 310 has a rectangular housing 320 with a rear panel 322 and an opposite front panel 324. In this example, the rear panel 322 includes electrical connection interfaces for connection to a pump controller module and power inputs from a power source. The housing 320 is designed to be inserted in registration features on the bottom panel 222 of the housing 200 of the coolant distribution unit 106 in FIG. 2. In this example, the rack 102 in FIG. 1 may include a separate power source that may be connected to the pumps 310 and 312 through the rear panel 322.

The front panel 324 is generally accessible to an operator who services the coolant distribution unit 106. As shown in FIG. 4, the front panel 324 includes a switch button 326 that allows the user to cutoff fluid flow to the pump 310. A locking mechanism 328 is also located on the front panel 324. The locking mechanism 328 serves to secure the pump 310 to the connectors of the manifold. The locking mechanism 328 is deactivated when the fluid flow is cutoff as will be explained below. The front panel 324 also includes a rotatable handle assembly 330 that facilitates the insertion or removal of the pump 310 from the housing 200 in FIG. 2 for replacement or maintenance.

The pump controller module may be a specialized controller such as a chassis management controller (CMC), or any other type of programmable controller device such as a complex programmable logic device (CPLD), an application specific integrated circuit (ASIC), or a field programmable gate array (FPGA) or general processor installed on the rack 102 in FIG. 1. If the pump controller is a dedicated specialized circuit device, such as an ASIC, the functions are designed in the hardware itself. If the controller includes programmable hardware such as a CPLD or an FPGA, the device hardware may be programmed before installation in the rack 102.

The rear panel 322 has a liquid inlet connector 340 and a liquid outlet connector 342. The housing 320 encloses internal fluid conduits and a motor that impels the coolant received from the inlet connector 340 out through the outlet connector 342. The inlet connector 340 includes a motor housing 344 that houses a motor that rotates a ball valve in the inlet connector 340. The ball valve is rotated by the motor to an open position to allow coolant flow and a closed position to prevent coolant flow. Similarly, the outlet connector 342 includes a motor housing 346 that houses a motor that rotates a ball valve in the outlet connector 342.

Similarly, the pump 312 has a housing 350 with a rear panel 352 with a liquid inlet connector 360 and a liquid outlet connector 362. The housing 350 encloses internal fluid conduits and a motor that impels the coolant received from the inlet connector 360 out through the outlet connector 362. Similar to the pump 310, a front panel 354 includes a switch button 356 for controlling the valves and a locking mechanism 358. A handle assembly 330 is attached to the front panel 354 to facilitate pulling out the pump 312. The inlet connector 360 includes a motor housing 364 that houses a motor that rotates a ball valve in the inlet connector 360. The outlet connector 362 includes a motor housing 366 that houses a motor that rotates a ball valve in the outlet connector 342.

The manifold unit 210 includes a separation manifold 370 and a merge manifold 372. The separation manifold 370 and the merge manifold 372 are joined together physically to form the manifold unit 210, but are fluidly isolated from each other. The separation manifold 370 includes the collection connector 240. Coolant is received by the collection connector 240. Coolant is circulated through the separation manifold 370 and internally guided to one of two outlet connectors 382 and 384 through internal conduits. In this example, the outlet connector 382 is fluidly coupled to the inlet connector 340 of the pump 310 while the outlet connector 384 is fluidly coupled to the inlet connector 360 of the pump 312. The outlet connector 382 includes a motor housing 386 that houses a motor that rotates a ball valve in the outlet connector 382. The ball valve is rotated by the motor to an open position to allow coolant flow and a closed position to prevent coolant flow. Similarly, the outlet connector 384 includes a motor housing 388 that houses a motor that rotates a ball valve in the outlet connector 384.

The merge manifold 372 includes the supply connector 242. Coolant is supplied to the closed loop system by the supply connector 242. Coolant is supplied to the merge manifold 372 from one of two inlet connectors 392 and 394. In this example, the inlet connector 392 is fluidly coupled to the outlet connector 342 of the pump 310 while the inlet connector 394 is fluidly coupled to the outlet connector 362 of the pump 312. Thus, coolant from the outlet connectors 332 and 362 is merged in the merge manifold 372 via internal conduits and supplied thorough the supply connector 242. The inlet connector 392 includes a motor housing 396 that houses a motor that rotates a ball valve in the inlet connector 392. The ball valve is rotated by the motor to an open position to allow coolant flow and a closed position to prevent coolant flow. Similarly, the inlet connector 394 includes a motor housing 398 that houses a motor that rotates a ball valve in the inlet connector 394.

In this example, the ball valves of the connectors on the pumps 310 and 312 and manifolds 370 and 372 may be electronically controlled to either close or open. When the inlet connector 340 of the pump 310 is connected to the corresponding outlet connector 382 of the manifold 370, an electrical connection is made via cables that provide power and control signals allowing control of the motor on the outlet connector 382. Similarly, when the outlet connector 342 of the pump 310 is connected to the corresponding inlet connector 394 of the manifold 370, an electrical connection is made via cables that provide power and control signals allowing control of the motor on the inlet connector 394. For example, by pushing the button 326 on the front panel 324 of the pump 310, power to the motors is provided via a control signal. The motors rotate the ball valves on the inlet connector 340 and the outlet connector 342 to a closed position. Pushing the button 326 also activates the motors on the outlet connector 384 of the separation manifold 370 and the inlet connector 394 of the merge manifold 272 to rotate the respective ball valves to the closed position. Once the ball valves are closed, the pump 310 may be disconnected from the manifolds 370 and 372 without the risk of coolant leaks. When the ball valves of the corresponding connectors are open, the locking mechanism 328 prevents the pump 310 from being disconnected from the manifolds 370 and 372.

Figure 5:
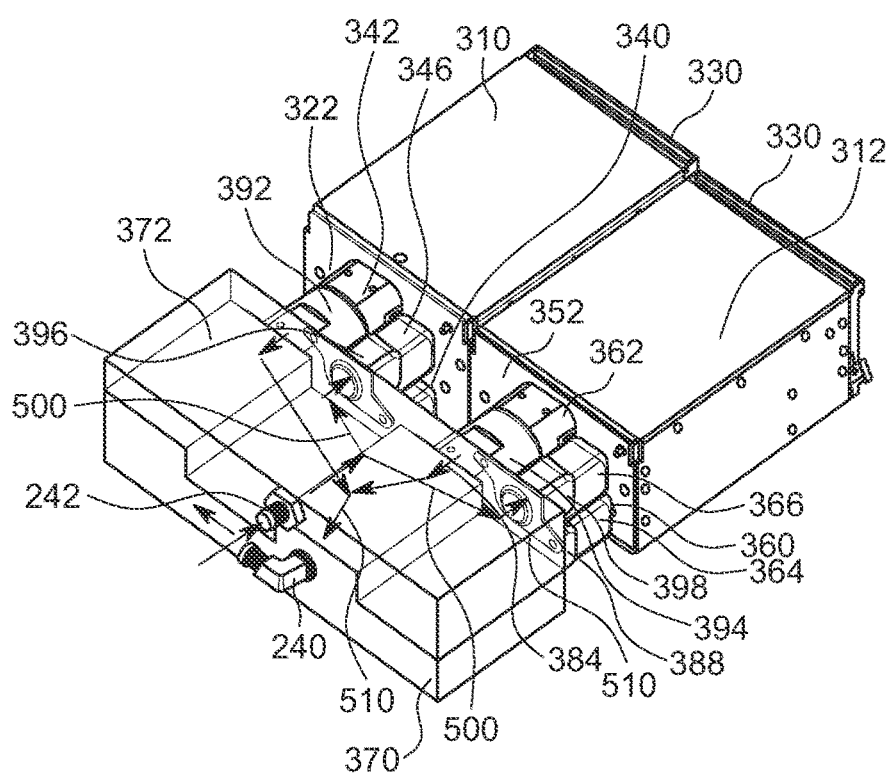
FIG. 5 is perspective view of the example manifold unit in FIG. 2 showing internal coolant flow to and from the two pumps according to certain aspects of the present disclosure.

FIG. 5 is a perspective view of the circulation of fluid through the pump module 220 and the manifold unit 210 during normal operation of the pump module 220. Like elements in FIG. 5 are labeled with like reference numbers from FIGS. 3 and 4. The separation manifold 370 collects coolant from the collection connector 240. Arrows 500 show that the collected coolant is separated by the internal conduits in the separation manifold 370 to the outlet connectors 382 and 384. The coolant from the outlet connector 382 is routed to the inlet connector 340 of the pumps 310 while the coolant from the outlet connector 384 is routed to the inlet connector 360 of the pump 312. The pumps 310 and 312 apply pressure to the coolant from the respective inlet connectors 340 and 360 and circulates the coolant through the respective outlet connectors 342 and 362.

The outlet connector 342 is fluidly connected to the inlet connector 394 of the merge manifold 372 while the outlet connector 362 is fluidly connected to the inlet connector 394. Arrows 510 show coolant that is circulated by the pumps 310 and 312 is supplied through the inlet connectors 392 and 394 of the merge manifold 372. The merged coolant is available for the liquid cooling system through the supply connector 242.

In normal operation of the liquid cooling system for the computer system 100, coolant is supplied by the supply connector 242 from the merge manifold 372. The coolant is supplied through the separation manifold 370 which acts to route the coolant into the two pumps 310 and 312. The pumps 310 and 312 provide propulsive pressure and force the coolant from the merge manifold 372 to the separation manifold 370.

When one of the pumps 310 or 312 fails or requires maintenance, a user may remove the non-functioning pump. The user first pushes the button on the pump that requires replacement to close the respective ball valves to prevent coolant flow to and from the pump. The pump may then be disconnected and replaced. The remaining functional pump will keep circulating the liquid to the cooling system through the manifold unit 210. Once the new pump is installed by connecting the respective connectors to the manifold, the button may then be pushed to open the respective ball valves. The pump may then be started and the cooling system will return to a normal operation through both pumps. Thus, replacing a pump allows the computer system 100 to continue to operate because the closed loop cooling system remains operational on one of the pumps. Although the pump module 220 has two pumps 310 and 312, additional pumps may be added to provide greater coolant circulation. Additional inlets and outlets may therefore be provided in the manifold unit 210 to be connected to the additional pumps. When either pump 310 or 312 is removed, the remaining pumps remain in operation to circulate coolant.

Figure 6:
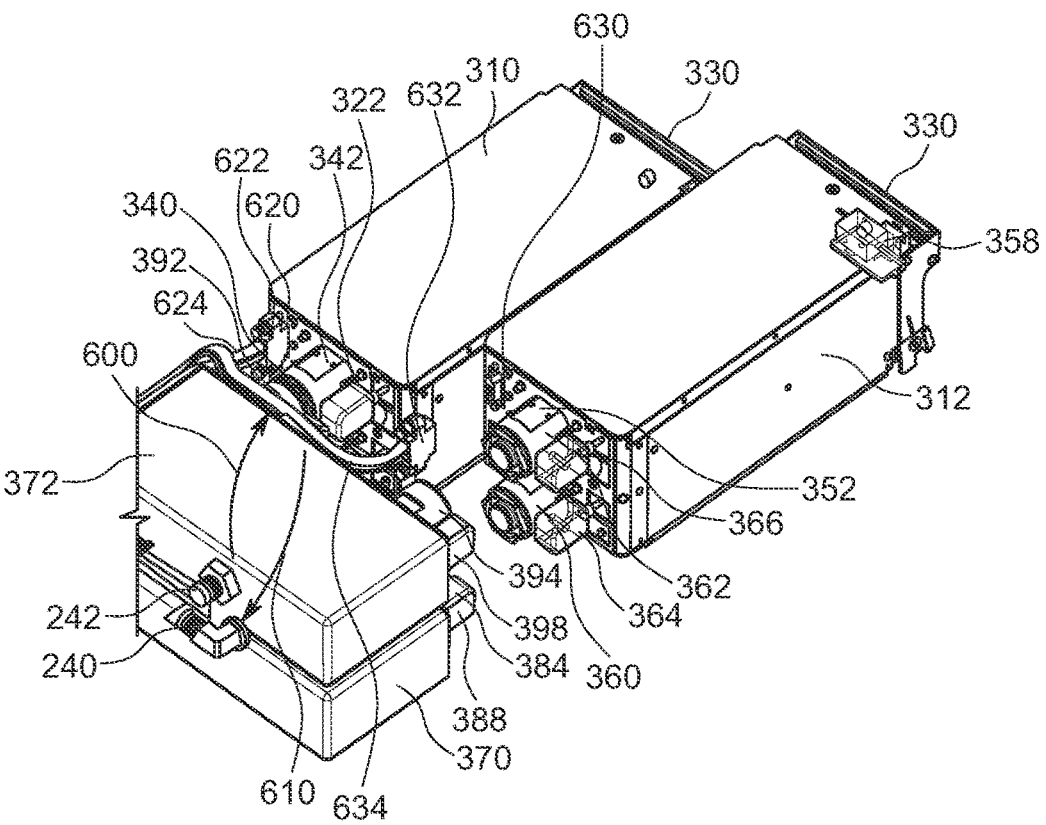
FIG. 6 is perspective view of the example manifold unit in FIG. 2 with one of the redundant pumps removed and the resulting diverted coolant flow according to certain aspects of the present disclosure.

FIG. 6 is a perspective view of the circulation of fluid through the pump module 220 and the manifold unit 210 when one of the pumps 310 or 312 is removed. Like elements in FIG. 6 are labeled with like reference numbers from FIGS. 3 and 4. When the pumps such as the pump 310 is installed, the outlet connector 382 of the manifold 370 is fluidly coupled to the inlet connector 340 of the pump 310 and the inlet connector 392 of the manifold 372 is fluidly coupled to the outlet connector 342. As shown in FIG. 6, the rear panel 322 of the pump 310 includes a socket connector 620 that mates with a connector 622 that is attached to a set of power and control cables 624. The connector 622 is connected to the socket connector 620 and the cables 624 provide power to the components of the pump 310 such as the internal motor and the ball values of the connectors 340 and 342 and the locking mechanism 328. The ball valve motors of the connectors on the manifolds 370 and 372 are powered separately from the manifolds 370 and 372.

As explained above, either the pump 310 or 312 may be pulled out of the housing 200 in FIG. 2 for replacement or repair. For example, if the pump 312 is to be removed, the operator will push the button 356 on the front panel 354 of the pump 312. The button 356 causes power to be engaged to the motors to turn the ball valves of the inlet connector 360 and the outlet connector 362 to the closed position. The button 356 also causes a control signal to be sent for power to be engaged to the motors to turn the ball valves of the corresponding outlet connector 384 of the manifold 370 and the inlet connector 394 of the manifold 372. After the ball values are turned off to cut off fluid communication between the pump 312 from the manifolds 370 and 372, the locking mechanism 358 may thus be released. The pump 312 may then be pulled out through the handle assembly 330 from the housing. As shown in FIG. 6, the rear panel 352 includes a socket connector 630 that is attached to a connector 632 that is attached to a set of power and control cables 634. Once the pump 312 is pulled out, the connector 632 may be detached from the socket 630.

Coolant as shown by arrows 600 continues to be received and circulated by the remaining pump 310 to the merge manifold 372 as shown by arrows 610. Thus, coolant continues to be received from the collection connector 240. The received coolant 600 is routed through internal conduits solely to the outlet connector 382 of the merge manifold 372 to the inlet connector 340 of the pump 310. The pump 310 pressurizes the received coolant, which is routed through the outlet connector 342 to the merge manifold 372 to the supply connector 242. In order to maintain the same circulation flow, the pressure provided by the pump 310 may be increased to compensate for the temporary unavailability of the removed pump 312.

Figure 7A:
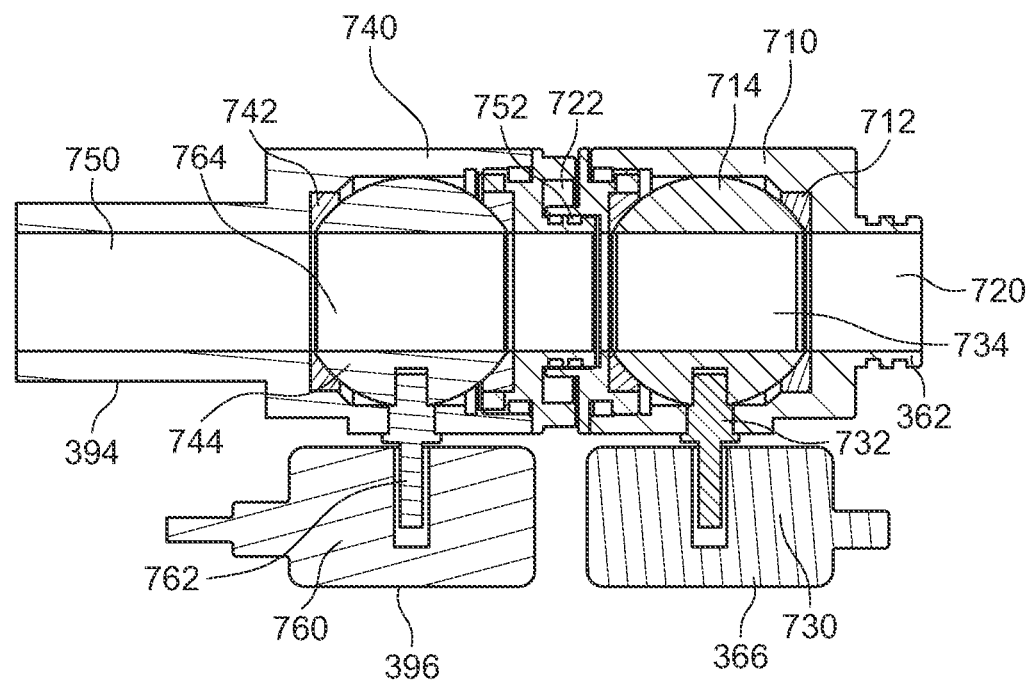
FIG. 7A is a cutaway top view of one of the pair of connectors between the manifold unit and the pumps of FIG. 2 in an open position, according to certain aspects of the present disclosure.
Figure 7B:
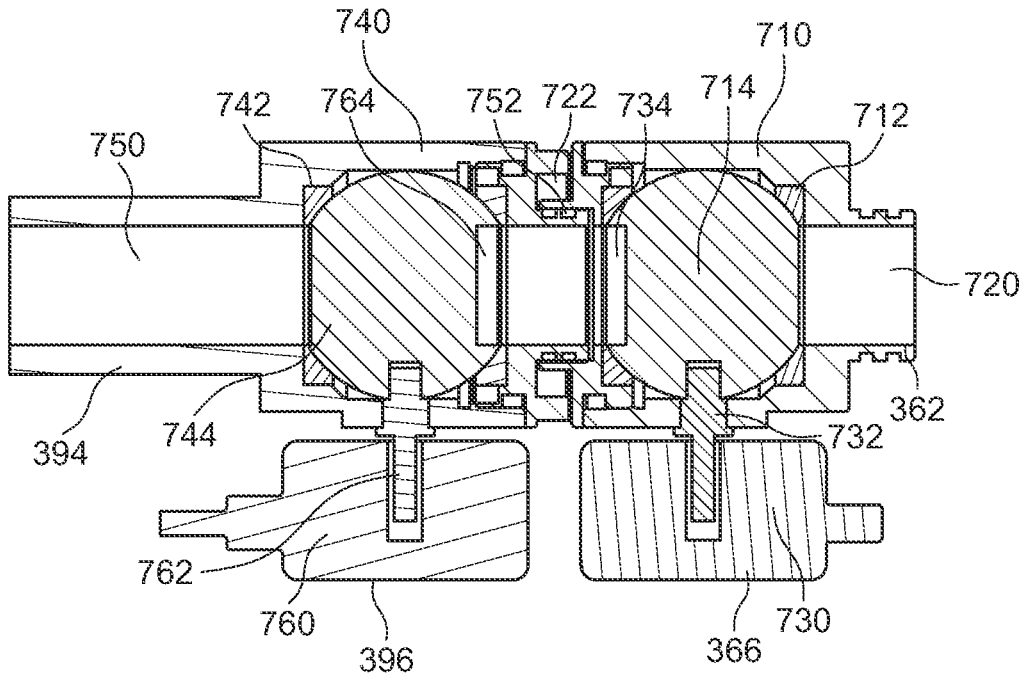
FIG. 7B is a cutaway top view of one of the pair of connectors between the manifold unit and the pumps of FIG. 2 in a closed position, according to certain aspects of the present disclosure.

FIGS. 7A-7B are top cutaway views of the outlet connectors 362 and 394 shown in FIGS. 3-6 in an open state and a closed state. The outlet connector 362 has a valve housing 710 that is attached to the motor housing 366. The valve housing holds a valve seat 712 that allows a ball valve 714 to rotate. The valve housing 710 includes a fluid conduit 720 that allows fluid communication from the pump 312. The valve housing 710 also includes a female fluid connector 722 that allows fluid flow through the outlet connector 362.

The motor housing 366 holds a motor 730 that is connected to a drive shaft 732 of the ball valve 714. The ball valve 714 has a center conduit 734 that allows fluid communication when aligned with the female fluid connector 722 and the fluid conduit 720 in an open position as shown in FIG. 7A. The motor 730 may rotate the ball valve 714 between the open position and a closed position shown in FIG. 7B by rotating the drive shaft 732. In the closed position, the fluid conduit 720 is rotated away and the body of the ball valve 714 blocks fluid flow between the female fluid connector 722 and the fluid conduit 720.

The inlet connector 394 has a valve housing 740 that is attached to the motor housing 396. The valve housing holds a valve seat 742 that allows a ball valve 744 to rotate. The valve housing 740 includes a fluid conduit 750 that allows fluid communication from the manifold 372. The valve housing 740 also includes a male fluid connector 752 that allows fluid flow through the inlet connector 394. When the pump 312 is connected to the manifold 372, the male fluid connector 752 is inserted in the female fluid connector 722 to allow fluid flow between the outlet connector 362 and the inlet connector 394.

The motor housing 396 holds a motor 760 that is connected to a drive shaft 762 of the ball valve 744. The ball valve 744 has a center conduit 764 that allows fluid communication when aligned with the connector 752 and the fluid conduit 750 in an open position as shown in FIG. 7A. The motor 760 may rotate the ball valve 744 between the open position and a closed position shown in FIG. 7B by rotating the drive shaft 762. In the closed position, the fluid conduit 750 is rotated away and the body of the ball valve 744 blocks fluid flow between the connector 752 and the fluid conduit 750.

Figure 8A:
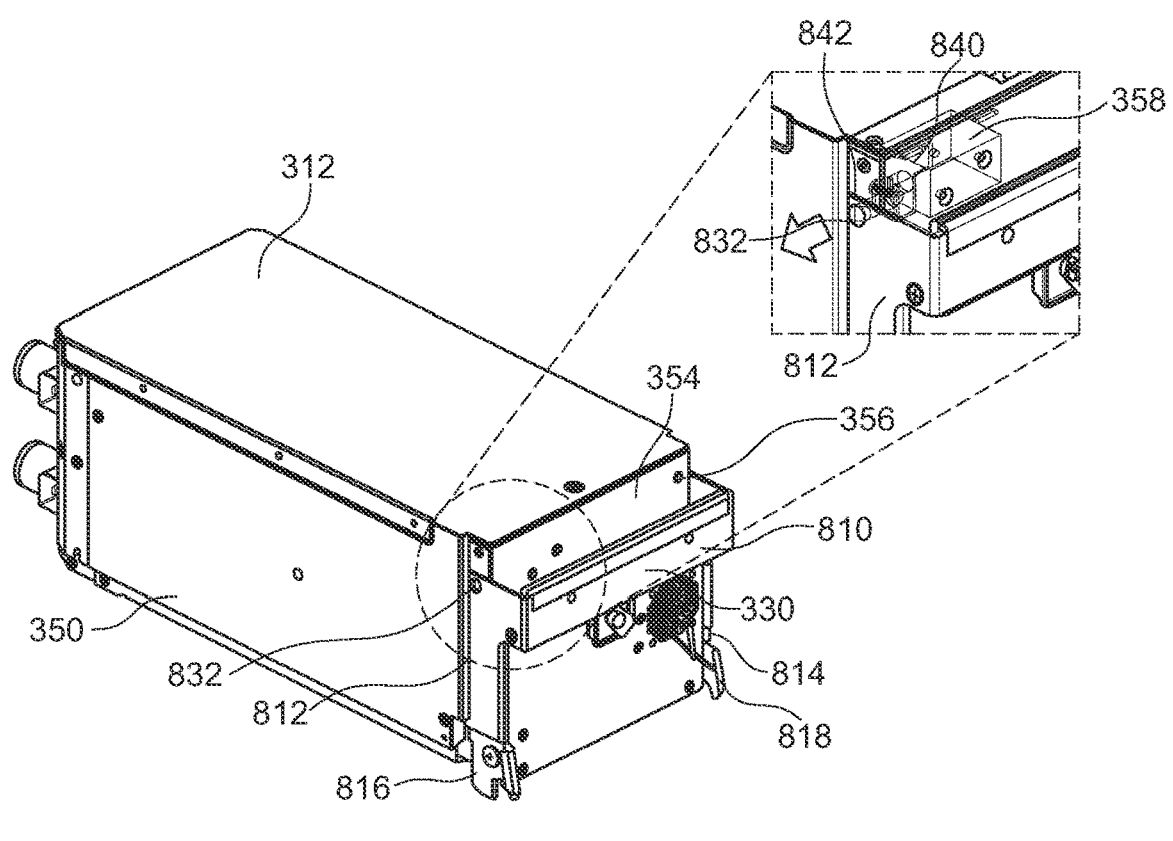
FIG. 8A is a close up perspective view of the locking mechanism of one of the redundant pumps in a locked position, according to certain aspects of the present disclosure.
Figure 8B:
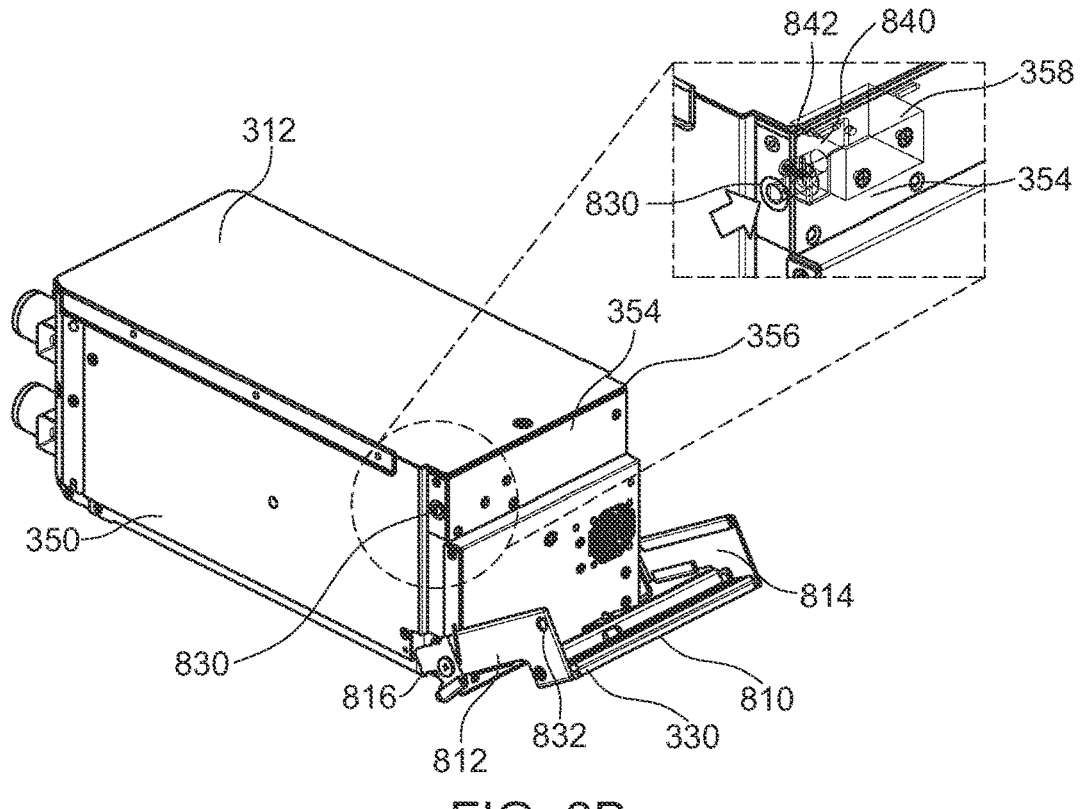
FIG. 8B is a close up perspective view of the locking mechanism of one of the redundant pumps in an unlocked position, according to certain aspects of the present disclosure.

FIG. 8A is a close up perspective view of the locking mechanism 358 of the pump 312 in a locked position. FIG. 8B is a close up perspective view of the locking mechanism 358, allowing the release of the handle assembly 330 to allow the pump 312 to be removed. As explained above, the button 356 on the front panel 354 of the pump 312 when pushed sends a control signal to motors connected to the ball valves of the connectors between the pump 312 and the manifolds 370 and 372 to rotate the ball valves to the closed position. The control signal allows the locking mechanism 358 to be unlocked. When the locking mechanism 358 is locked as shown in FIG. 8A, the handle assembly 330 locks the pump 312 in place. Thus, the locking mechanism 358 prevents removal of the pump 312 unless coolant communication is cutoff, thereby preventing leaks when the pump 312 is removed.

The handle assembly 330 includes a handle bar 810 that is attached the ends of two parallel support members 812 and 814. The opposite ends of the support member 812 and 814 are attached to hinge mechanisms 816 and 818 that allow the rotation of the support members 812 and 814 between a locked position in FIG. 8A and an pull down position in FIG. 8B. The user may pull on the handle bar 810 to pull the pump 312 when the handle assembly 330 is in the pull down position in FIG. 8A.

The locking mechanism 358 is mounted on an interior side of the housing 350 of the pump 312. The housing 350 of the pump 312 includes an access hole 830. The support member 812 also includes an access hole 832 that is aligned with the access hole 830 when the handle assembly 330 is in the locked position. The locking mechanism 358 includes an electro-magnetic actuator 840 that moves a pin 842 to an extended position and a retracted position. When the actuator 840 moves the pin to the extended position, the pin extends through the access holes 830 and 832 thus holding the support member 812 of the handle assembly 330 in the locked position in FIG. 8A. In this example, the actuator 840 provides force against an internal spring that forces the pin 842 into a retracted position shown in FIG. 8A. When the handle assembly 330 is in the locked position, the pump 312 cannot be removed as the actuator 840 holds the pin 842 into the access hole 832. When the ball valves of the connectors are closed, a control signal cuts off power to the actuator 840 and the pin 842 is forced by the internal spring into the retracted position. The pin 842 thus is retraced from the access hole 832 and allows the handle assembly 330 to be moved into the pull down position to release the pump 312. The user may then pull the handle assembly 330 to remove the pump 312.

Figure 9:
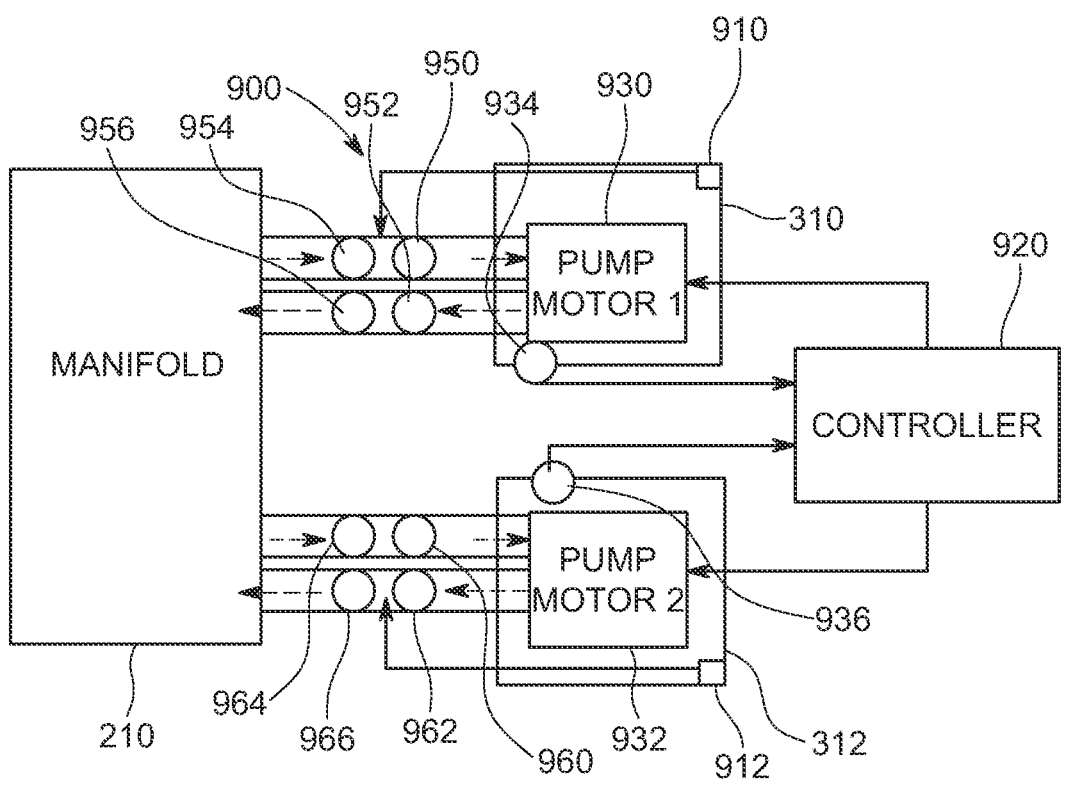
FIG. 9 is a circuit diagram of the control switch for the valve motors of the connectors between one of the pumps and the manifold, according to certain aspects of the present disclosure.

FIG. 9 is a block diagram of a pump control system 900 that controls the motor speed and thus the flow pressure of the pumps 310 and 312 in FIG. 3. The pump control system 900 also includes user inputs 910 and 912 that allow closing or opening of the valves that control coolant flow between the pumps 310 and 312 and the manifold unit 210. The pump control system 900 includes a controller 920 that regulates the pumps 310 and 312 to maintain desired fluid pressure for circulating coolant through the manifold unit 210. The controller 920 provides speed control signals to a circulator such as a pump motor 930 of the pump 310 and a circulator such as a pump motor 932 of the pump 312. Thus, the controller 920 controls the flow rate of each of the pumps 310 and 312. The controller 920 sets the speed control signals based on the circulation of cooling fluid required by the computer system 100 in FIG. 1. The controller 920 also will adjust the speed control signals to the pump motors 930 and 932 if one of the pumps 310 or 312 is removed. Speed sensors 934 and 936 respectively are connected to the controller 920 to provide motor speed measurements, which may be correlated to flow measurements of the fluid being circulated through the manifold unit 210. In this example, a simple control routine may set the pumps 310 and 312 at half duty when the pump module 220 is operating normally. If a pump is removed, the routine will set the other pump to run at maximum duty to allow the same level of coolant circulation. Alternatively, flow rate sensors may be attached to the collection connector 240 and the supply connector 242 of the manifold unit 210. The overall flow of the coolant generated by the pumps 310 and 312 may be determined and the speed control signals may be adjusted accordingly.

The input 910 sends a control signal to provide power to a motor 950 that rotates the ball valve of the inlet connector 340 and a motor 952 that rotates the ball valve of the outlet connector 342 of the pump 310. The input 910 also sends a control signal to provide power to a motor 954 that rotates the ball valve of the outlet connector 382 of the merge manifold 372 and a motor 956 that rotates the ball valve of the inlet connector 392 of the separation manifold 370. As explained above fluid flow (shown by dashed arrows) to and from the pump 310 may be blocked by closing the ball valves through the motors 950, 952, 954, and 956.

The input 912 sends a control signal to provide power to a motor 960 that rotates the ball valve of the inlet connector 360 and a motor 962 that rotates the ball valve of the outlet connector 362 of the pump 310. The input 912 also sends a control signal to provide power to a motor 964 that rotates the ball valve of the outlet connector 384 of the merge manifold 372 and a motor 966 that rotates the ball valve of the inlet connector 394 of the separation manifold 370.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A replaceable pump for circulating coolant, the pump comprising:

an inlet connector having a valve powered by a first motor;

an outlet connector having a valve powered by a second motor;

a circulator propelling coolant between the inlet connector and the outlet connector;

a valve control input to activate the first and second motors to move the valves between an open position allowing coolant flow and a closed position blocking the coolant flow; and a locking mechanism operable to keep the inlet and outlet connectors connected when the valves are in the open position.

2. The replaceable pump of claim 1, wherein the valves are ball valves rotated by the first and second motors.

3. The replaceable pump of claim 1, wherein the inlet connector includes a first electrical connector, and wherein the inlet connector is operable to be in fluid connection with another outlet connector of a separation manifold, wherein the another outlet connector of the separation manifold includes a valve powered by a third motor, the third motor controlled by the first electrical connector; and wherein the outlet connector includes a second electrical connector, and wherein the outlet connector is operable to be in fluid connection with another inlet connector of a merge manifold, wherein the another inlet connector of the merge manifold includes a valve powered by a fourth motor, the fourth motor controlled by the second electrical connector.

4. The replaceable pump of claim 1, further comprising a rotatable handle assembly having a locked position that prevents removal of the pump from a coolant distribution unit and a pull down position that allows removal of the pump from the coolant distribution unit, wherein the locking mechanism holds the rotatable handle assembly in the locked position.

5. A coolant distribution unit for circulating coolant to a heat-generating component, the coolant distribution unit comprising:

a manifold unit having a supply connector to supply coolant to the heat-generating component and a collection connector to collect coolant from a heat exchanger;

a first pump fluidly coupled to an outlet connector of the manifold unit via a first inlet connector, the first inlet connector having a first electronically controlled valve powered by a first motor, and a first electrical connector, wherein the outlet connector of the manifold unit includes an outlet connector valve powered by a second motor, the second motor controlled by the first electrical connector, the first pump being further fluidly coupled to an inlet connector of the manifold unit via a first outlet connector, the first outlet connector having a second first electronically controlled valve powered by a third motor and a second electrical connector, wherein the inlet connector of the manifold unit includes an inlet connector valve powered by a fourth motor controlled by the second electrical connector, the first pump circulating coolant from the first inlet connector to the first outlet connector; and a second pump having a second inlet connector coupled to the manifold unit and a second outlet connector coupled to the manifold unit, the second pump circulating the coolant from the second inlet connector to the second outlet connector, wherein the first pump may be disconnected from the manifold unit when the first and second electronically controlled valves are closed to prevent coolant flow, while the second pump continues to circulate the coolant through the manifold unit.

6. The coolant distribution unit of claim 5, wherein the manifold unit includes a separation manifold coupled to the first inlet connector and the second inlet connector, the manifold unit further including a merge manifold coupled to the first outlet connector and the second outlet connector.

7. The coolant distribution unit of claim 5, further comprising a third pump having a third inlet connector coupled to the manifold unit and a third outlet connector coupled to the manifold unit, the third pump circulating the coolant from the third inlet connector to the third outlet connector, wherein the third pump continues to circulate the coolant when the second pump is disconnected from the manifold unit.

8. The coolant distribution unit of claim 5, wherein the heat-generating component includes a heat-generating computational component and internal conduits to circulate the coolant received from the manifold unit.

9. The coolant distribution unit of claim 8, wherein the heat-generating component is one of an application server, a storage server, a storage device, or a network switch.

10. The coolant distribution unit of claim 5, further comprising a housing having an open end, the housing holding the first and second pumps, wherein the first and second pumps may be removed from the housing from the open end.

11. The coolant distribution unit of claim 5, wherein the first and second electronically controlled valves are ball valves rotated by the motors controlled by a push button for the first pump.

12. The coolant distribution unit of claim 5, wherein the first pump includes a locking mechanism preventing disconnection of the first pump from the manifold.

13. A computer system comprising:

a computer component having a heat-generating device, a conduit to circulate a coolant, a hot coolant connector, and a cold coolant connector;

a heat exchanger configured to receive hot coolant from the hot coolant connector and to supply cooled coolant;

a manifold unit fluidly coupled to the heat exchanger to receive the cooled coolant and to supply the cooled coolant to the cold coolant connector; and a pump module coupled to the manifold unit to circulate the coolant between the heat exchanger, the manifold unit, and the computer component, the pump module including:

a first pump fluidly coupled to the manifold unit via a first inlet connector having a first electronically controlled valve and a second outlet connector having a second electronically controlled valve, the first pump including a first locking mechanism operable to keep the first inlet connector and second outlet connector connected when the first and second valves are in the open position, and wherein the first pump circulating the coolant from the first inlet connector to the second outlet connector; and a second pump having a second inlet connector coupled to the manifold unit and a second outlet connector coupled to the manifold unit, the second pump circulating the coolant from the second inlet connector to the second outlet connector, wherein the first pump may be disconnected from the manifold unit when the first and second electronically controlled valves are closed to prevent coolant flow, while the second pump continues to circulate the coolant through the manifold unit.

14. The computer system of claim 13, wherein the manifold unit includes a separation manifold coupled to the first and second inlet connectors and a merge manifold coupled to the first and second outlet connectors.

15. The computer system of claim 13, wherein the pump module further includes a third pump having a third inlet connector coupled to the manifold unit and a third outlet connector coupled to the manifold unit, the third pump circulating the coolant from the third inlet connector to the third outlet connector, wherein the third pump continues to circulate the coolant when the second pump is disconnected from the manifold unit.

16. The computer system of claim 13, wherein the computer component includes internal conduits to circulate the coolant received from the manifold unit.

17. The computer system of claim 16, wherein the computer component is one of an application server, a storage server, a storage device, or a network switch.

18. The computer system of claim 13, further comprising a coolant distribution unit having a housing, wherein the housing holds the manifold unit and pump module.

19. The computer system of claim 13, further comprising a rack holding the computer component, the manifold unit and the pump module, wherein the rack includes a door holding the heat exchanger.

\* \* \* \* \*